United States Patent [19]

Fujii

[11] Patent Number: 5,463,325
[45] Date of Patent: Oct. 31, 1995

[54] APPARATUS FOR MEASURING CHARACTERISTICS OF ELECTRONIC PARTS

[75] Inventor: Toshifumi Fujii, Kyoto, Japan

[73] Assignee: Rohm Co., Ltd., Kyoto, Japan

[21] Appl. No.: 282,817

[22] Filed: Jul. 29, 1994

Related U.S. Application Data

[63] Continuation of Ser. No. 30,798, Mar. 12, 1993, abandoned.

[30] Foreign Application Priority Data

May 28, 1992 [JP] Japan .................................. 4-163494

[51] Int. Cl.⁶ .................................................. G01R 1/067
[52] U.S. Cl. ................................................................ 324/761
[58] Field of Search ............................ 414/222, 416, 414/786; 324/756, 757, 758, 759, 760, 761, 762; 209/573, 571

[56] References Cited

U.S. PATENT DOCUMENTS

| | | | |
|---|---|---|---|
| 4,899,107 | 2/1990 | Corbett et al. | 324/758 |
| 4,918,383 | 4/1990 | Huff et al. | 324/758 |
| 4,926,118 | 5/1990 | O'Connor et al. | 324/158 F |
| 4,935,695 | 6/1990 | Hayes et al. | 324/758 |
| 4,987,365 | 1/1991 | Shreeve et al. | 3/758 |
| 5,094,584 | 3/1992 | Bullock | 414/786 |
| 5,180,976 | 1/1993 | Van Loan et al. | 324/158 F |

*Primary Examiner*—Kenneth A. Wieder
*Assistant Examiner*—Barry C. Bowser
*Attorney, Agent, or Firm*—Brumbaugh, Graves, Donohue & Raymond

[57] ABSTRACT

Disclosed is a measuring apparatus in which electrical characteristics of electronic parts can be measured in a substantially reduced measurement time. The measuring apparatus includes a tray for mounting a plurality of the electronic parts, a measuring mechanism having a plurality of measuring terminals positioned in accordance with the respective positions of the electrodes in the plurality of electronic parts mounted on the tray, and a drive mechanism for moving the tray and the measuring mechanism relative to each other to thereby cause the respective electrodes of the electronic parts mounted on the tray engage the corresponding measuring terminals in the measuring mechanism.

10 Claims, 3 Drawing Sheets

APPARATUS FOR MEASURING CHARACTERISTICS OF ELECTRONIC PARTS

This application is a continuation of application Ser. No. 08/030,798, filed on Mar. 12, 1993, now abandoned.

BACKGROUND OF THE INVENTION

This invention relates to measuring apparatus for electronic parts and, more particularly, to apparatus for measuring electrical characteristics of electronic parts such as semiconductor devices.

In conventional measuring apparatus for electronic parts, the electronic parts are measured one by one. That is, electronic parts are carried one-by-one by means of, for example, a slide or the like into a measuring unit provided with measuring terminals corresponding to the electrodes, such as lead terminals or the like, of a single electronic part. The electrodes of one of the electronic parts are engaged by corresponding measuring terminals of the measuring unit so that the electrical characteristics of the single electronic part can be measured. Then the single electronic part which has been measured is withdrawn from the measuring unit, and another electronic part is moved into the measuring unit in the same manner and is measured therein.

In such a conventional measuring apparatus, however, there are the following problems.

When such conventional apparatus is used, it is necessary to carry out the steps of moving an electronic part into the measuring unit, positioning the electrodes of the electronic part in the unit with respect to the corresponding measuring terminals, measuring the positioned electronic part, and then withdrawing the measured electronic part out of the measuring unit. Therefore, when a plurality of electronic parts are to be measured, the time required to complete the measurement is the total time required to move one of the electronic parts into the unit, measuring the electronic part, and then withdrawing the electronic part, multiplied by the number of the electronic parts. Accordingly, the time for the complete measurement operation is prolonged.

SUMMARY OF THE INVENTION

It is therefore an object of the present invention to provide an apparatus for measuring characteristics of electronic parts which overcomes the foregoing problems of the prior art.

Another object of the present invention is to provide a measuring apparatus for electronic parts by which a plurality of electronic parts can be measured in a much shorter total measurement time.

These and other objects of the invention are attained by providing an apparatus for measuring electrical characteristics of electronic parts which includes a tray for mounting a plurality of electronic parts, a measuring mechanism having a plurality of measuring terminals corresponding to the respective positions of the electrodes of all of the electronic parts mounted on the tray, and a drive mechanism for moving the tray and the measuring mechanism relative to each other to cause the respective electrodes of the electronic parts mounted on the tray to be engaged by corresponding measuring terminals provided in the measuring mechanism.

The operation of the measuring apparatus according to the present invention will now be described.

The plurality of electronic parts are mounted on the tray. In the measuring mechanism, a plurality of measuring terminals are provided so as to correspond to the positions of the electrodes in each of the electronic parts mounted on the tray, and the measuring terminals are electrically connected to measuring instruments. The drive mechanism moves the tray and the measuring mechanism relative to each other so as to make the electrodes of the electronic parts mounted on the tray engage the corresponding measuring terminals provided in the measuring mechanism. It is therefore possible to arrange a plurality of electronic parts so that all of the electronic parts can be measured simultaneously after the electronic parts have been moved simultaneously into the measuring mechanism and positioned relative to the corresponding measuring terminals of the measuring mechanism. After completion of the measurement, the electronic parts are moved out of the measuring mechanism simultaneously on the tray.

BRIEF DESCRIPTION OF THE DRAWINGS

Other features and advantages of the present invention will be apparent from a reading of the following description in conjunction with the accompanying drawings, in which.

DESCRIPTION OF PREFERRED EMBODIMENTS

Figure 1:
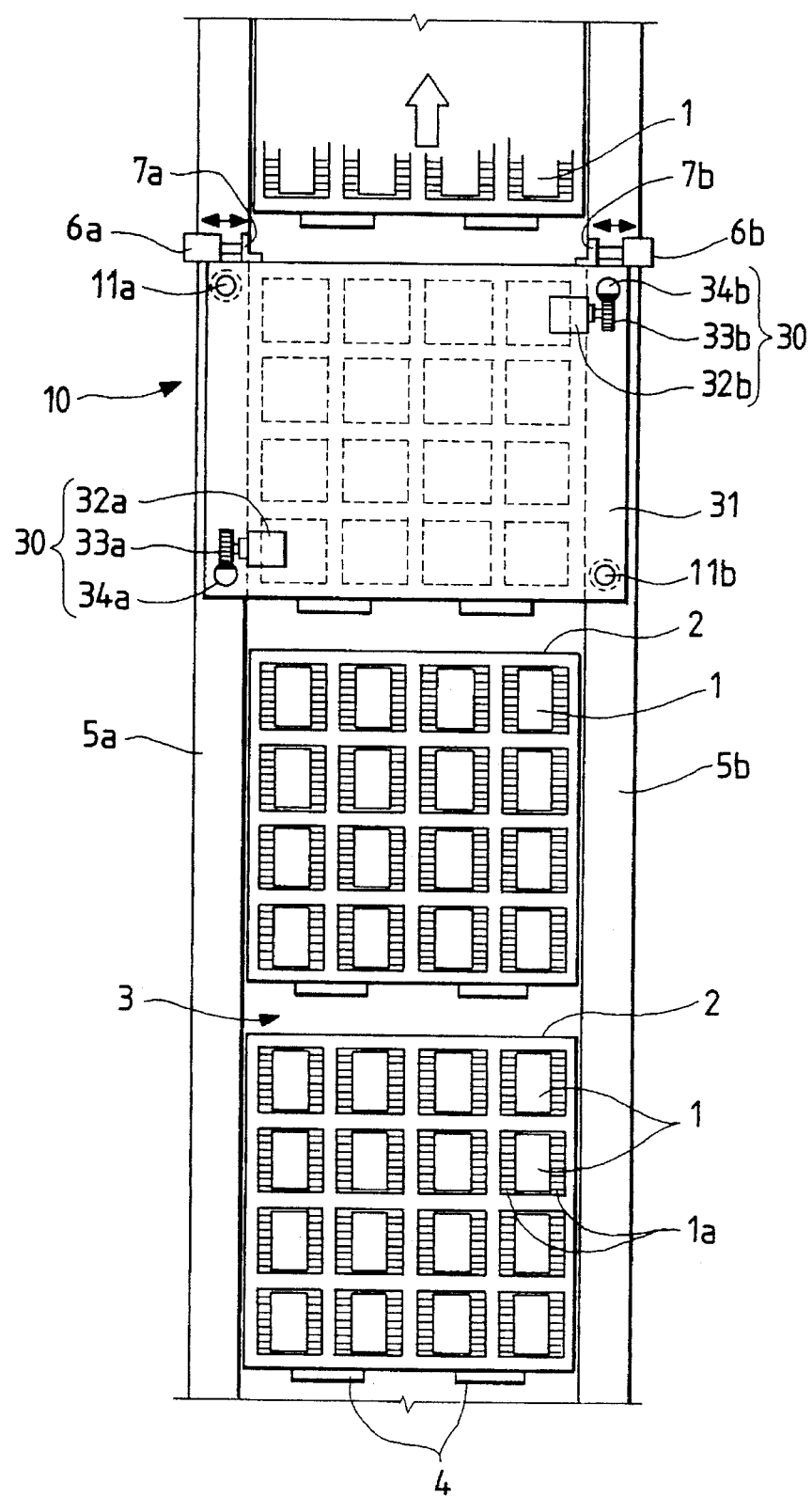
FIG. 1 is a plan view illustrating the arrangement of a representative embodiment of a measuring apparatus for electronic parts according to the present invention.
Figure 2:
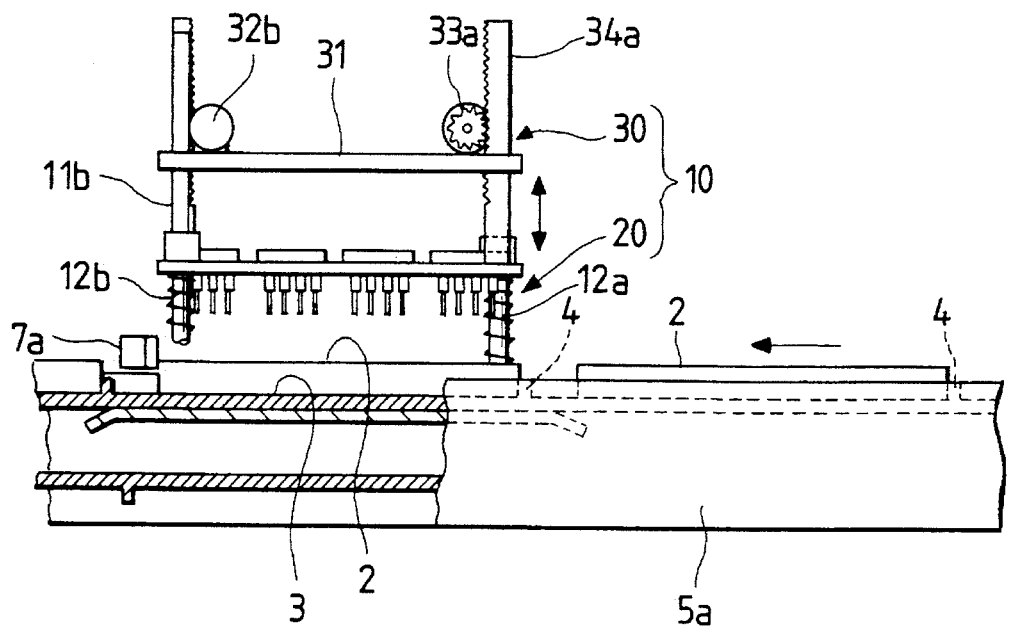
FIG. 2 is a fragmentary side view illustrating the embodiment shown in FIG. 1.

In the representative embodiment of the invention shown in FIGS. 1 and 2, the structure of a complete measuring apparatus for electronic parts according to the present invention is illustrated. FIG. 1 is a plan view showing the arrangement of an apparatus for measuring an array of flat packages, which are a type of electronic part, and FIG. 2 is a fragmentary view thereof.

As illustrated, a tray 2 on which sixteen flat packages 1 are mounted at predetermined intervals is placed on a conveyor 3 which is driven intermittently, and the rear portion of the tray 2 is engaged by two protrusions 4 provided on the conveyor 3 at predetermined spacings. When the conveyor 3 is moved, the tray 2 is advanced by the protrusions 4 in the direction of the arrow in FIG. 1. In addition, fixed guide walls 5a and 5b are provided on the opposite sides of the conveyor 3 so as to guide the motion of the tray 2.

A measuring apparatus 10 is mounted at a predetermined position on the path of motion of the tray 2. The measuring apparatus 10 includes a measuring mechanism 20 for measuring a batch of flat packages 1 mounted on the tray 2, and a drive mechanism 30 for moving the measuring mechanism 20 up and down. The structure of the measuring apparatus 10 will be described in detail hereinafter.

A pair of upright support shafts 11a and 11b are mounted on the guide walls 5a and 5b and the measuring apparatus 10 is supported on the shafts 11a and 11b. A measurement support plate 21 is mounted on the support shafts 11a and 11b so as to be movable up and down, and a driving support plate 31 is affixed to the support shafts 11a and 11b above the measurement support plate 21. Two reversible motors 32a and 32b are mounted on the driving support plate 31 and two pinions 33a and 33b are mounted on the output shafts of the motors 32a and 32b, respectively. Two racks 34a and 34b are arranged to pass through the driving support plate 31 to engage the pinions 33a and 33b, respectively, the lower ends of the racks 34a and 34b being connected to the measurement support plate 21. Further, two coil springs 12a and 12b are mounted on the support shafts 11a and 11b, respectively, and are located beneath the measurement support plate 21 so as to prevent the measurement support plate 21 from shaking during vertical movement.

A positioning mechanism for stopping the tray 2 in the measurement position beneath the measurement support plate 21 is provided on the downstream side in the direction of motion of the tray 2 relative to the position of the measuring unit 10. This positioning mechanism consists of two air cylinders 6a and 6b provided on the guide walls 5a and 5b, and two stop members 7a and 7b mounted at the ends of the cylinder shafts. The positioning mechanism is arranged so that the shafts of the respective air cylinders 6a and 6b extend to cause the members 7a and 7b to engage the tray 2 which is being carried so as to stop and hold the tray 2 in the measurement position.

Figure 3:
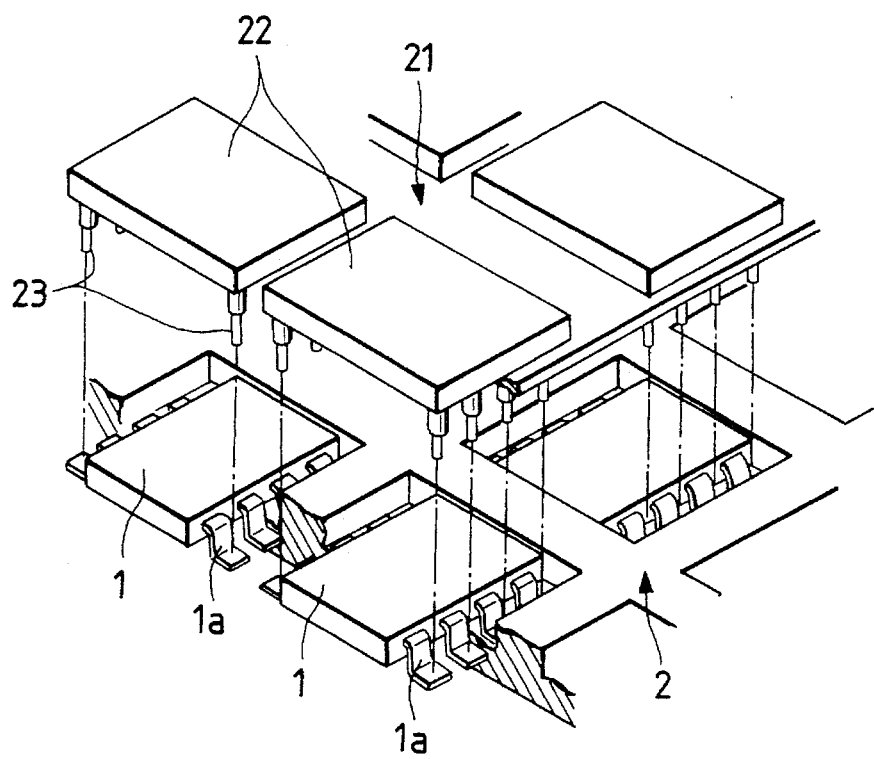
FIG. 3 is a schematic perspective view illustrating the arrangement of the measuring mechanism of FIG. 1.

An array of measuring terminal units 22 is mounted on the measurement support plate 21. The number of the measuring terminal units 22 in the array is equal to the number of the flat packages 1 mounted on the tray 2, and the measuring terminal units 22 are arranged so as to correspond to the arrangement of the respective flat packages 1 mounted on the tray 2. A plurality of measuring terminals 23 are attached to each of the measuring terminal units 22. The number of the measuring terminals 23 in each unit is equal to the number of lead terminals 1a which are electrodes of the flat packages 1 to be measured, and the measuring terminals 23 are arranged so as to correspond to the arrangement of the lead terminals 1a of the flat packages 1. That is, as shown in FIG. 3, when the measurement support plate 21 is moved toward the tray 2 which has been carried into the measurement position, all the lead terminals 1a of the respective flat packages 1 mounted on the tray 2 are engaged by the corresponding measuring terminals 23 of the measuring terminal units 22 mounted on the measurement support plate 21.

Figure 4:
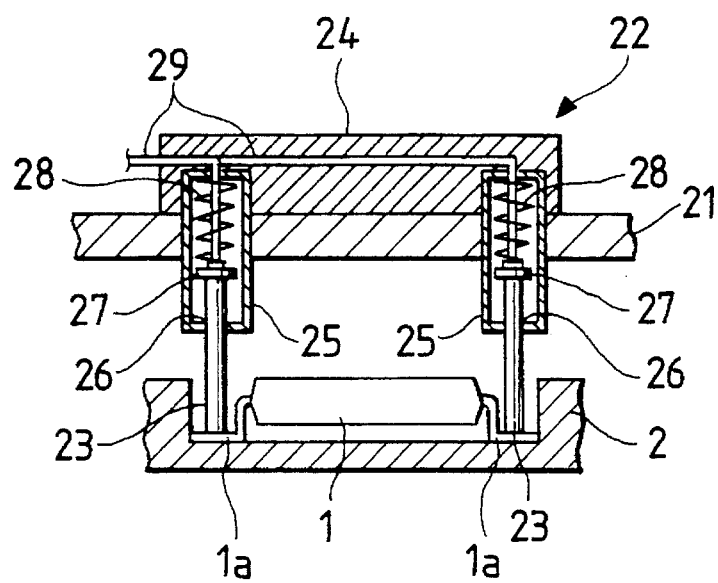
FIG. 4 is a sectional view illustrating the structure of a measuring unit.

FIG. 4 shows the detailed structure of the measuring terminal unit 22. As shown in FIG. 4, a plurality of measuring terminal reception cylinders 25 are provided in the lower portions of a measuring unit body 24 so that the measuring terminals 23 project downwardly from the inside of the measuring terminal reception cylinders 25 through holes 26 formed in the lower surfaces of the measuring terminal reception cylinders 25. Flanges 27 are provided at the upper ends of the respective measuring terminals 23, and compression coil springs 28 are inserted between the flanges 27 and the upper ends of the measuring terminal storage cylinders 25, respectively. These compression coil springs 28 relieve the impact produced when the measuring terminals 23 engage the lead terminals 1a and ensure that all of the measuring terminals 23 engage the lead terminals 1a even if there are differences in the engagement positions of the measuring terminals 23 and the lead terminals. Further, the measuring terminals 23 are connected to a measuring instrument (not shown) through corresponding switches (not shown) so that each measuring terminal unit 22 can be connected to the measuring instrument by suitable operation of the switches. If the measuring instrument is capable of measuring all of the measuring terminal units 22 at the same time or if a number of measuring instruments corresponding to the number of measuring terminal units 22 is provided, it is not necessary to provide the switches.

Next, the measurement of the flat packages 1 by using this measuring apparatus will be described.

The tray 2, on which a plurality of flat packages 1 are mounted, is moved in the direction of the arrow in FIG. 1 by the conveyor 3. When the tray 2 is moved to a position below the measurement support plate 21, the conveyor 3 stops and, at the same time, the positioning mechanism stops the tray 2 in the measurement position, that is, at the position where all of the measuring terminals 23 of the measurement support plate 21 and all the lead terminals 1a of the flat packages 1 mounted on the tray 2 are opposite to each other. Such stopping of the tray 2 in the measurement position constitutes the simultaneous completion of motion of the plurality of flat packages 1 into the measurement position.

Upon completion of the motion of the tray 2, the motors 32a and 32b are rotated synchronously, so that the measurement support plate 21 comes down. The motors 32a and 32b are stopped in the position at which all of the lead terminals 1a engage the corresponding measuring terminals 23 so that the descent of the measurement support plate 21 is stopped, and the lead terminals 1a and the measuring terminals 23 engaging the corresponding lead terminals 1a are maintained in position. Consequently, all of the flat packages 1 mounted on the tray 2 are in condition for measurement.

By controlling the switches between the measuring terminals 23 and the measuring instrument, the electrical characteristics of the flat packages 1 are measured sequentially. Alternatively, as has been described, all the flat packages 1 are measured at the same time if the instrument has a configuration by which all the flat packages 1 can be measured simultaneously.

Upon completion of measurement of all the flat packages 1 mounted on the tray 2, the shafts of the air cylinders 6a and 6b are retracted and the conveyor 3 is driven to remove the tray 2 which has been measured and move in the next tray 2.

Although a measuring apparatus for measuring flat packages has been described in the above-mentioned embodiment, the present invention is not limited to this, but can be applied to a measuring apparatus for measuring various electronic parts other than flat packages, such as semiconductor devices, chip capacitors, chip resistors, etc.

Figure 5:
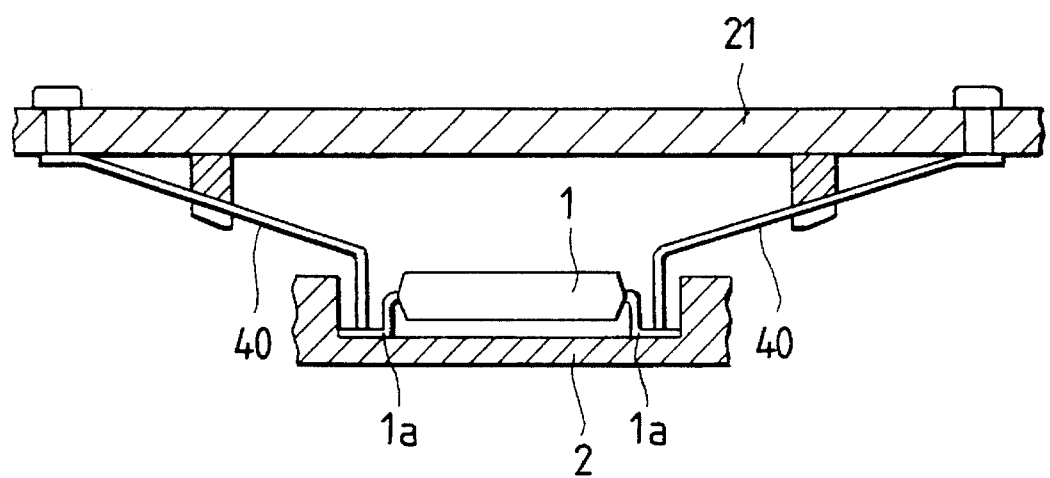
FIG. 5 is a sectional view illustrating the arrangement of a modified form of a measuring unit according to the invention.

Further, the present invention can be modified in various ways. For example, the measuring terminal unit 22 shown in FIG. 4 may be replaced by a measuring terminal unit having a radial arrangement of resilient probes 40 on the lower surface of the measurement support plate 21 as shown in FIG. 5.

Further, although the measuring mechanism 20 is moved vertically to measure a number of electronic parts mounted on the tray 2 at the same time in the illustrated embodiment, such measurement may be attained by moving the tray 2 vertically while the measuring mechanism 20 is fixed. Moreover, the arrangement for moving the tray 2 into the measuring unit portion 10 is not limited to a conveyor, but instead, for example, a robot arm or the like may be used to move the tray 2.

As is apparent from the above description, according to the present invention, a plurality of electronic parts are mounted on a tray so as to be carried at the same time, so that the time to move a plurality of electronic parts into and out of a measuring mechanism can be greatly reduced. Further, the measuring mechanism is provided with measuring terminals corresponding to the arrangement of the electrodes of the plurality of electronic parts mounted on the tray, and a driving mechanism makes the electrodes engage the corresponding measuring terminals to thereby bring them into condition for measurement, so that the preparations for measurement of all of the respective electronic parts are completed at the same time. It is therefore possible to shorten the time required for the preparations for measurement when measuring a plurality of electronic parts to greatly improve the efficiency of measurement of the electronic parts.

Although the invention has been described herein with reference to specific embodiments, many modifications and variations therein will readily occur to those skilled in the art. Accordingly, all such variations and modifications are included within the intended scope of the invention.

What is claimed is:

1. A measuring apparatus for measuring electrical characteristics of electronic parts comprising:

a tray formed with lateral guide edges and with a plurality of vertical recesses for receiving a corresponding plurality of electronic parts having electrodes, each recess in the tray being shaped to receive and retain an individual electronic part in vertically fixed position in the recess and in laterally fixed position in the tray with respect to the lateral guide edges with the electrodes exposed for vertical access by a measuring means;

measuring means having a plurality of resiliently supported measuring terminals positioned according to the positions of the electrodes of the plurality of electronic parts mounted on the tray; and drive means for moving the tray and the measuring means relatively to each other to thereby make the respective electrodes of the plurality of electronic parts mounted on the tray engage with corresponding measuring terminals in the measuring means.

2. A measuring apparatus for measuring electrical characteristics of electronic parts according to claim 1, in which said drive comprises:

a first drive means for conveying said tray means to said measuring means in a horizontal direction; and a second drive means for moving said measuring means up and down relative to said tray in a vertical direction.

3. A measuring apparatus for measuring electrical characteristics of electronic parts according to claim 2, wherein said first drive means has fixed guide walls on the opposite sides thereof so as to guide the motion of said tray.

4. A measuring apparatus for measuring electrical characteristics of electronic parts according to claim 3, further comprising:

a positioning for stopping said tray means in a predetermined measurement position.

5. A measuring apparatus for measuring electrical characteristics of electronic parts according to claim 2, wherein said second drive means comprises:

a pair of upright support shafts mounted on said guide walls for supporting said measurement means;

said measuring means comprises:

a measurement support plate mounted on said support shafts so as to be movable up and down; and a driving support plate affixed to said support shafts above said measurement support plate.

6. A measuring apparatus for measuring electrical characteristics of electronic parts according to claim 5, wherein said second drive means further comprises:

two reversible motors mounted on said driving support plate;

two pinions mounted on the output shaft of the motors, respectively; and two racks arranged to pass through said driving support plate to engage said pinions, respectively, the lower ends of said racks being connected to said measurement support plate.

7. A measuring apparatus for measuring electrical characteristics of electronic parts according to claim 5, wherein said second drive means further comprises:

two coil springs mounted on said support shafts, respectively, and located beneath the measurement support plate so as to prevent the measurement support plate from shaking during vertical movement.

8. A measuring apparatus for measuring electrical characteristics of electronic parts according to claim 4, wherein said positioning means comprises:

two air cylinders provided on said guide walls, and two stop members mounted at the ends of said cylinder shaft.

9. A measuring apparatus for measuring electrical characteristics of electronic parts according to claim 1 including at least one compression spring for each of the plurality of resiliently supported measuring terminals.

10. A measuring apparatus for measuring electrical characteristics of electronic parts according to claim 1 wherein the resiliently supported measuring terminals include a radial arrangement of resilient probes.

* * * * *

UNITED STATES PATENT AND TRADEMARK OFFICE
CERTIFICATE OF CORRECTION

PATENT NO. : 5,463,325
DATED : October 31, 1995
INVENTOR(S) : Toshifumi Fujii

It is certified that error appears in the above-indentified patent and that said Letters Patent is hereby corrected as shown below:

Column 5, line 42, [Claim 2, line 3]: "drive" should read --drive means--;

Column 5, line 43, [Claim 2, line 4]: "tray means" should read --tray--;

Column 6, line 4, [Claim 4, line 4]: "a positioning for stopping said tray means" should read --a positioning means for stopping said tray--;

Signed and Sealed this

Nineteenth Day of March, 1996

Attest:

BRUCE LEHMAN

Attesting Officer     Commissioner of Patents and Trademarks